(12) United States Patent
Nishimura

(10) Patent No.: US 7,861,909 B2
(45) Date of Patent: Jan. 4, 2011

(54) REPLENISHED LEAD-FREE SOLDER AND A CONTROL METHOD FOR COPPER DENSITY AND NICKEL DENSITY IN A SOLDER DIPPING BATH

(75) Inventor: Tetsuro Nishimura, Osaka (JP)

(73) Assignee: Nihon Superior Sha Co., Ltd. (JP)

( * ) Notice: Subject to any disclaimer, the term of this patent is extended or adjusted under 35 U.S.C. 154(b) by 218 days.

(21) Appl. No.: 11/995,868

(22) PCT Filed: Jul. 19, 2006

(86) PCT No.: PCT/JP2006/314240

§ 371 (c)(1),
(2), (4) Date: Jan. 16, 2008

(87) PCT Pub. No.: WO2007/010927

PCT Pub. Date: Jan. 25, 2007

(65) Prior Publication Data

US 2009/0289102 A1    Nov. 26, 2009

(30) Foreign Application Priority Data

Jul. 19, 2005  (JP) .............................. 2005-208134

(51) Int. Cl.
B23K 31/02 (2006.01)
(52) U.S. Cl. ..................... 228/102; 228/103; 228/256; 228/259
(58) Field of Classification Search ............... None
See application file for complete search history.

(56) References Cited

U.S. PATENT DOCUMENTS

| | | | | |
|---|---|---|---|---|
| 3,924,794 A | * | 12/1975 | Allen et al. ................. | 228/256 |
| 4,619,841 A | * | 10/1986 | Schwerin ................. | 297/284.6 |
| 5,110,036 A | | 5/1992 | Parker, Jr. | |
| 5,837,191 A | * | 11/1998 | Gickler ..................... | 420/560 |
| 6,139,979 A | * | 10/2000 | Takaoka et al. ............ | 428/646 |
| 6,180,055 B1 | * | 1/2001 | Tetsuro ..................... | 420/560 |

(Continued)

FOREIGN PATENT DOCUMENTS

EP    0491492    6/1992

(Continued)

OTHER PUBLICATIONS

International Preliminary Report on Patentability issued regarding International Application No. PCT/JP2006/314240 (Jan. 31, 2008).

(Continued)

Primary Examiner—Kiley Stoner
(74) Attorney, Agent, or Firm—Thompson Hine LLP

(57) ABSTRACT

Lead-free solder is replenished to a solder bath to receive a work having copper, the work to be processed subsequent to a soldering process using an air knife or a die. The replenished lead-free solder includes Sn as a major composition and at least 0.01 to 0.5 mass percent Ni. By replenishing the lead-free solder having the above composition, the density of the solder bath, being sharply changed for using one of a HASL device and a die, is quickly restored back to within an appropriate range.

6 Claims, 2 Drawing Sheets

U.S. PATENT DOCUMENTS

| | | | |
|---|---|---|---|
| 6,241,942 B1* | 6/2001 | Murata et al. | 420/561 |
| 6,296,722 B1* | 10/2001 | Nishimura | 148/400 |
| 6,440,360 B1* | 8/2002 | Sawamura et al. | 420/560 |
| 6,474,537 B1* | 11/2002 | Hasegawa et al. | 228/260 |
| 6,699,306 B2* | 3/2004 | Nishimura et al. | 75/386 |
| 7,282,175 B2* | 10/2007 | Amagai et al. | 420/562 |
| 7,338,567 B2* | 3/2008 | Munekata et al. | 148/400 |
| 2002/0015659 A1* | 2/2002 | Sawamura et al. | 420/557 |
| 2002/0015660 A1* | 2/2002 | Murata et al. | 420/561 |
| 2002/0134200 A1* | 9/2002 | Nishimura et al. | 75/646 |
| 2002/0150787 A1* | 10/2002 | Yoshitome et al. | 428/647 |
| 2002/0155024 A1* | 10/2002 | Hwang | 420/561 |
| 2003/0091463 A1* | 5/2003 | Izumida et al. | 420/560 |
| 2003/0132271 A1* | 7/2003 | Kao et al. | 228/180.22 |
| 2003/0230361 A1* | 12/2003 | Takahashi | 148/24 |
| 2004/0115088 A1* | 6/2004 | Ohnishi | 420/560 |
| 2004/0126270 A1* | 7/2004 | Izumida et al. | 420/560 |
| 2004/0241039 A1* | 12/2004 | Hwang | 420/561 |
| 2005/0008525 A1* | 1/2005 | Pfarr et al. | 420/560 |
| 2005/0036902 A1* | 2/2005 | Amagai et al. | 420/557 |
| 2006/0024194 A1* | 2/2006 | Izumida et al. | 420/560 |
| 2006/0104854 A1* | 5/2006 | Kobayashi et al. | 420/524 |
| 2006/0208042 A1* | 9/2006 | Protsch et al. | 228/260 |
| 2007/0012750 A1* | 1/2007 | Kobayashi et al. | 228/180.5 |
| 2007/0092396 A1* | 4/2007 | Huang et al. | 420/557 |
| 2007/0172381 A1* | 7/2007 | Deram | 420/561 |
| 2007/0243098 A1* | 10/2007 | Ohnishi et al. | 420/560 |
| 2009/0129970 A1* | 5/2009 | Sung | 420/560 |
| 2009/0173770 A1* | 7/2009 | Izumida et al. | 228/173.5 |
| 2009/0232696 A1* | 9/2009 | Ohnishi et al. | 420/561 |

FOREIGN PATENT DOCUMENTS

| | | |
|---|---|---|
| EP | 0985486 | 3/2000 |
| EP | 1225001 | 7/2002 |
| EP | 1464431 | 10/2004 |
| JP | 04-291990 | 10/1992 |
| JP | 2000-225490 | 4/2000 |
| JP | 2000-197988 | 7/2000 |
| JP | 2001-217531 | 8/2001 |
| JP | 2001-237536 | 8/2001 |
| JP | 2001-237536 A * | 8/2001 |
| JP | 2001-287082 | 10/2001 |
| JP | 2003-082448 | 3/2003 |
| JP | 2004-261864 | 9/2004 |
| WO | 01/62433 | 8/2001 |

OTHER PUBLICATIONS

International Search Report issued regarding International Application No. PCT/JP2006/314240 (Oct. 24, 2006).

EP, Supplementary European Search Report, European Application No. 06781247.9 (May 15, 2009).

EP, Examination Report, European Application No. 06781247.9 (Jul. 16, 2009).

* cited by examiner

REPLENISHED LEAD-FREE SOLDER AND A CONTROL METHOD FOR COPPER DENSITY AND NICKEL DENSITY IN A SOLDER DIPPING BATH

TECHNICAL FIELD

The present invention relates to lead-free solder to be replenished to control densities of copper (Cu) and nickel (Ni) in a solder dipping bath in case the densities quickly change caused by particular conditions of subsequent process and to the control method of the Cu density and the Ni density in the solder dipping bath under the particular condition.

BACKGROUND OF THE ART

Solder alloy having a quasi Sn—Pb eutectic structure is widely used because of the low melting point and reliability thereof. However, the demand for lead-free solder is rising up because of the standpoint of environment protection. Lead-free solder having Sn—Cu structure currently in widespread use, in particular, Sn—Cu—Ni structure offers a higher fluidity than other lead-free solder. The Sn—Cu—Ni solder is favorable because it is free from soldering failures including smoothing failure of the soldering surface, solder bridge, through hole joint, dry joint, and so on, which could be problematic during bulk production.

A printed circuit board with Cu film coated of electronic apparatuses, and electronic components having Cu lead wires or Cu tapes are immersed into a solder dipping bath for soldering. Cu can dissolve into the solder dipping bath, thereby gradually raising the Cu density in the solder dipping bath. As a result, an Sn—Cu intermetallic compound having a high-melting point, not melting at a predetermined soldering temperature in the solder dipping bath develops. The compound adheres to the work to be soldered. Soldering quality is thus degraded. A density control technique has been proposed to overcome this problem in Japanese Open Gazette No. 2001-237536. According to the technique, additional solder having low Cu density is supplied to the solder dipping bath to control the Cu density to a constant density level or below.

DESCRIPTION OF PRIOR ART

Japanese Open Gazette No. 2001-237536

DISCLOSURE OF INVENTION

Problems to be Solved by the Invention

For example, subsequent to a tinning process of immersing a work into a solder dipping bath and then picking up the work from the solder dipping bath, a leveling process is typically performed using a so-called hot-air solder leveler device (hereinafter referred to as HASL). In the leveling process, excess solder is removed by blowing high-temperature and high-pressure air against the work using an air knife. This process causes a density rise substantially higher than a change in the Cu density of the solder dipping bath expected in the above described Cu density control technique. More specifically, regardless of small process amount, a rise pace in the Cu density of the solder dipping bath is extremely high. This particular phenomenon also takes place when a work is expanded using a die.

When the HASL device removes excess solder from the work subsequent to the immersion to the solder dipping bath, the Ni density of the Sn—Cu—Ni lead-free solder in the solder dipping bath rapidly drops regardless of small work process amount. The decrease in the Ni density causes a poor fluidity of molten solder, leading to smoothing failure of the soldering surface, hole, dry joint, and other problems. During bulk production, those problems could lead to a serious problem such as a stop of entire production line. In this way, the control of the Cu density and the Ni density in the solder dipping bath are very important factor to maintain reliable production.

The present invention has been developed in view of the above problems, and it is an object of the present invention to provide lead-free solder to be replenished to control the rapidly changing Cu and Ni densities to within an appropriate range without replacing the existing solder in the solder dipping bath and a method of controlling the Cu and Ni densities.

Means to Solve the Problems

The inventor of this invention has studied to find out a solution to respond to a rapid change in the Cu and Ni densities of the molten solder in the solder dipping bath, the rapid density change unresolved by any conventional methods. More specifically, the inventor has studied particular conditions when the HASL device or the die is used in a following process. The particular conditions are different from conditions in the density control method adopted in the wave soldering technique in which a wave is caused by spraying molten solder and Cu component is dissolved only when the wave impinges on the rear surface of a printed board.

For example, since the HASL device sprays high-temperature and high-pressure air, the sprayed air gives some impact to the work itself. As a result, not only solder to be removed but also some amount of Cu on the surface of the work is removed. According to a further study, the inventor has found that a physical force (impact or the like) on the work by the HASL device and the die removes a solder layer including an interface layer $(Ni,Cu)_6Sn_5$ formed between Cu on the surface of the work and a solder layer.

Cu on the work side is more abundant than on the solder layer, easily migrates into the interface layer between the work and the solder layer, thereby forming a Cu-rich layer. If the solder layer including the interface layer between the solder and the work is removed by the HASL device or the like, the recirculation of the solder into the solder dipping bath rapidly increases the Cu density in the solder dipping bath.

The rapid rise in the Cu density of the solder dipping bath develops the Sn—Cu intermetallic compound. The Sn—Cu intermetallic compound stays on the bottom of the solder dipping bath. Since the Sn—Cu intermetallic compound is crystallized with Ni taken from within the solder dipping bath, the Ni density in the solder dipping bath rapidly drops. Even if the operating temperature of the solder dipping bath is maintained at about 260° C. in order that the development of the Sn—Cu intermetallic compound is delayed, the rapid rise in the Cu density cannot be controlled. As a result, the Sn—Cu intermetallic compound develops on the bottom of the solder dipping bath, naturally leading to the Ni capturing. Ni, scarce in the lead-free solder, is typically not contained in a printed circuit board as the work. Each time the work is processed, the Ni density of the solder dipping bath is lowered. Since a small amount of Ni is an essential factor of the Sn—Cu—Ni solder providing a high fluidity, a timely replenishing of Ni, which is decreasing as a result of work process, is important for reliable production.

When a particular device such as HASL device is to be used, the change in the Cu and Ni densities of the solder dipping bath is sharp, and precise density control is required. After intensive study from the above point of view, the inventor has found it necessary to replenish an additional solder supply before the Cu density has increased by a predetermined amount as a maximum change of density, and the Ni density has decreased by a predetermined amount as a maximum change of density. The inventor has also found that optimum density control cannot be achieved without controlling compositions of the lead-free solder to be replenished.

Lead-free solder of the present invention is replenished to a solder dipping bath that receives a work including one of a printed circuit board having copper film coated thereon, a copper lead wire, and a copper tape, the work to be processed subsequent to a soldering process using one of an air knife and a die. The lead-free solder includes Sn as a major component and at least Ni having a density falling within a range from equal to or higher than 0.01 mass percent to equal to or lower than 0.5 mass percent. By replenishing the lead-free solder having this composition, the solder in the solder dipping bath, changed in density due to the use of the HASL device or the die in the solder post process, is quickly restored back to within an appropriate density range.

The Cu density of the lead-free solder to control the Cu density and the Ni density in the solder dipping bath has a maximum permissible density of 1.2 mass percent. Preferably, the Cu density is 0.7 mass percent or lower from the standpoint of controlling the development of the intermetallic compound such as excess $(Ni,Cu)_6Sn_5$. The eutectic point of Sn—Cu is 0.7 mass percent. More preferably, the Cu density is 0.5 mass percent or lower. The Sn—Ni lead-free solder having no Cu at all is the most preferable, because it reduces the Cu density in the entire solder dipping bath fastest. On the other hand, the density of Ni preferably falls within a range from equal to or higher than 0.05 mass percent to equal to or lower than 0.3 mass percent. The eutectic point of Sn—Ni is 0.15 mass percent, and a width of 0.1 mass percent downward and a width of 0.15 mass percent upward with respect to 0.15 mass percent are set as the range. Within this range, control of the replenishment of Ni is considered to be easy. The most preferable range is from equal to or higher than 0.1 mass percent to equal to or lower than 0.2 mass percent. Within this range, a variation in the Cu density is controlled to a small range when the solder is replenished. The solder composition is thus stabilized.

A control method of controlling densities of Cu and Ni in solder in a solder dipping bath includes a step of immersing a work including one of a printed circuit board having copper film coated thereon, a copper lead wire, and a copper tape into the solder dipping bath for soldering, and circulating solder removed from the work by one of an air knife or a die back into the solder dipping bath. The lead-free solder is replenished to the solder in the solder dipping bath before the density of Cu in the solder dipping bath is increased by a maximum of 0.5 mass percent from a predetermined value and the density of Ni in the solder dipping bath is decreased by a maximum of 0.03 mass percent from a predetermined value, the replenished lead-free solder including Sn as a major component, Cu having a density falling 1.2 mass percent or lower and Ni having a density falling within a range from equal to or higher than 0.01 mass percent to equal to or lower than 0.5 mass percent. In accordance with this method, the rapidly changing densities in the solder dipping bath is measured continuously or continually, and the solder is replenished before the predetermined amount of rise or the predetermined amount of fall is reached. Even if the Cu and Ni densities in the solder dipping bath sharply change with the HASL device or the die used in the solder post process, appropriate density control is performed and solder failure rate is reduced. Without interrupting the solder process, reliable production is assured.

In accordance with the control method of the present invention, the lead-free solder is replenished before an increase from the predetermined amount in the Cu density becomes a maximum of 0.3 mass percent and a decrease from the predetermined amount in the Ni density becomes a maximum of 0.02 mass percent. Sufficient margin to achieve reliable production is thus maintained, and the solder dipping bath is kept at a low operating temperature. These factors are preferred from the standpoint of reliable production. As for the composition of the lead-free solder to be replenished, the above preferable density ranges of Cu and Ni are applied to the control method of the present invention.

In any of the above embodiments, the advantages of the present invention are provided if the lead-free solder to be replenished contains, in addition to Cu and Ni, germanium (Ge) and phosphorus (P) as an antioxidant, each having a density of about 0.1 mass percent. The addition of Ge contributes more to the prevention of Cu leaching than the addition of P. Even lead-free solder containing no other elements than Sn, Cu and Ni can enjoy the advantages of the present invention. In the comparison of the lead-free solder additionally containing Ge and P with the lead-free solder containing only Sn, Cu and Ni with no other additional elements, the former is preferable. The lead-free solder additionally containing Ge and P restrains oxidation of solder, thereby resulting in less oxides (less dross), and permitting less oxides to be adhered to products. Lead-free solder to be replenished containing Co instead of Ni is subject to the same problem as the one using Ni, but the problem is overcome by the present invention. The form of solder to be replenished is free, for example, a solder bar, a solder wire, etc, and any form of solder provides the advantages of the present invention.

EFFECT OF THE INVENTION

When a work is picked up from a solder dipping bath after being immersed into the solder dipping bath, and is subjected to the process of one of a HASL device and a die, replenishment solder of the present invention quickly restores the Cu density and the Ni density, rapidly changing through the process, back to within an appropriate density range. According to the present invention, the replenishment solder prevents various problems such as hole and dry joints caused as a result of poor fluidity of molten Sn—Cu—Ni lead-free solder. Production of the work is reliably performed. In accordance with the control method of the present invention for controlling the Cu density and the Ni density of the solder dipping bath, appropriate density control is performed with failure rate reduced even when the Cu density and Ni density in the solder dipping bath quickly change. Without interrupting the soldering process, reliable production process is continued in particular in bulk production.

PREFERRED EMBODIMENTS OF THE INVENTION

The embodiments of the present invention are described below. Described first is an embodiment in which excess solder is removed from a printed board using an air knife of a HASL device after the printed board as a work is immersed into a solder dipping bath.

In this embodiment, lead-free solder containing no elements other than Sn, Cu and Ni was used. More specifically, the composition of the lead-free solder was Cu of 0.7 mass percent, Ni of 0.05 mass percent, and Sn as the remaining. The lead-free solder became molten at temperature of 265° C. in the solder dipping bath. Under such conditions, a printed board as a work is vertically shifted down and remained immersed in the molten solder in the solder dipping bath for a period of 1 to 5 seconds, and then lifted up at a speed of 10 cm/s to 20 cm/s from the solder dipping bath. Using an air knife of a HASL device, heated air of 280° C. is sprayed onto two approximately opposed locations of both sides of the printed board from two positions so that an air pressure of 0.098 MPa to 0.294 MPa is caused on the work while the work was being lifted up. While such a solder operation was repeated consecutively by several times, the Cu density and the Ni density in the solder dipping bath were measured each time the work was processed.

Figure 1:
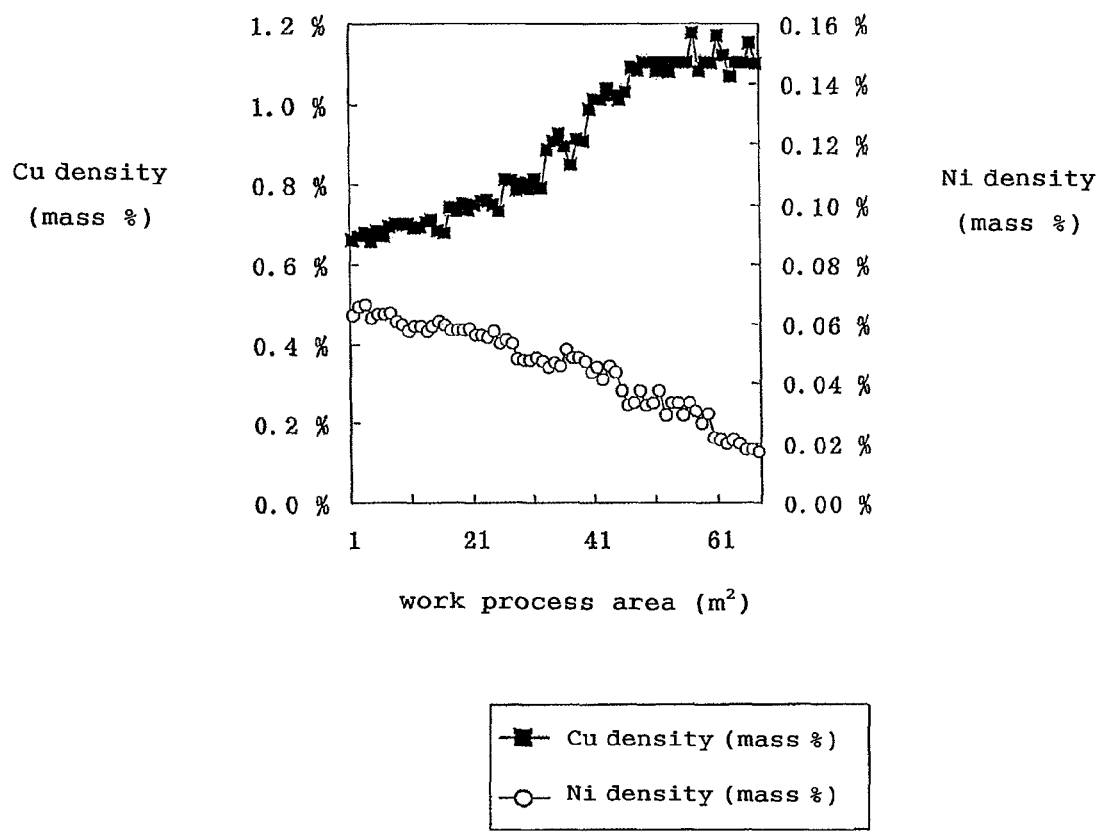
FIG. 1 is a plot of change in a Cu density and a Ni density of a solder dipping bath in a continuous soldering process with an air knife used in a post soldering process.

FIG. 1 is a plot of the Cu density and the Ni density in the solder dipping bath while the soldering process described above is consecutive performed. Herein, the ordinate (Y axis) represents the Cu density (mass percent), and the Ni density (mass percent), and the abscissa (X axis) represents a process area ($m^2$) of the printed board as a work. As shown in FIG. 1, the Cu density in the solder dipping bath rapidly increases regardless of the small work process area while the Ni density rapidly decreases with the increase in the work process area. With the soldering process and the process of the HASL device continuing, insoluble Sn—Cu intermetallic compounds begin to develop even if the operating temperature is maintained at 260° C. or higher. The Cu density of the solder dipping bath stops to rise while a large amount of Sn—Cu intermetallic compounds was found on the wall and the bottom of the solder dipping bath. This forced the stop of the soldering operation. The Ni density continued to decrease even after the Cu density stopped rising. This is because as the Sn—Cu intermetallic compounds increased the compounds captured Ni. The initial sharp rate of change of density is found to be about 10 times the rate of change in the Cu density in the wave soldering technique (in other words, the gradient of the Cu density rise in the process of a standard printed circuit area).

Figure 2:
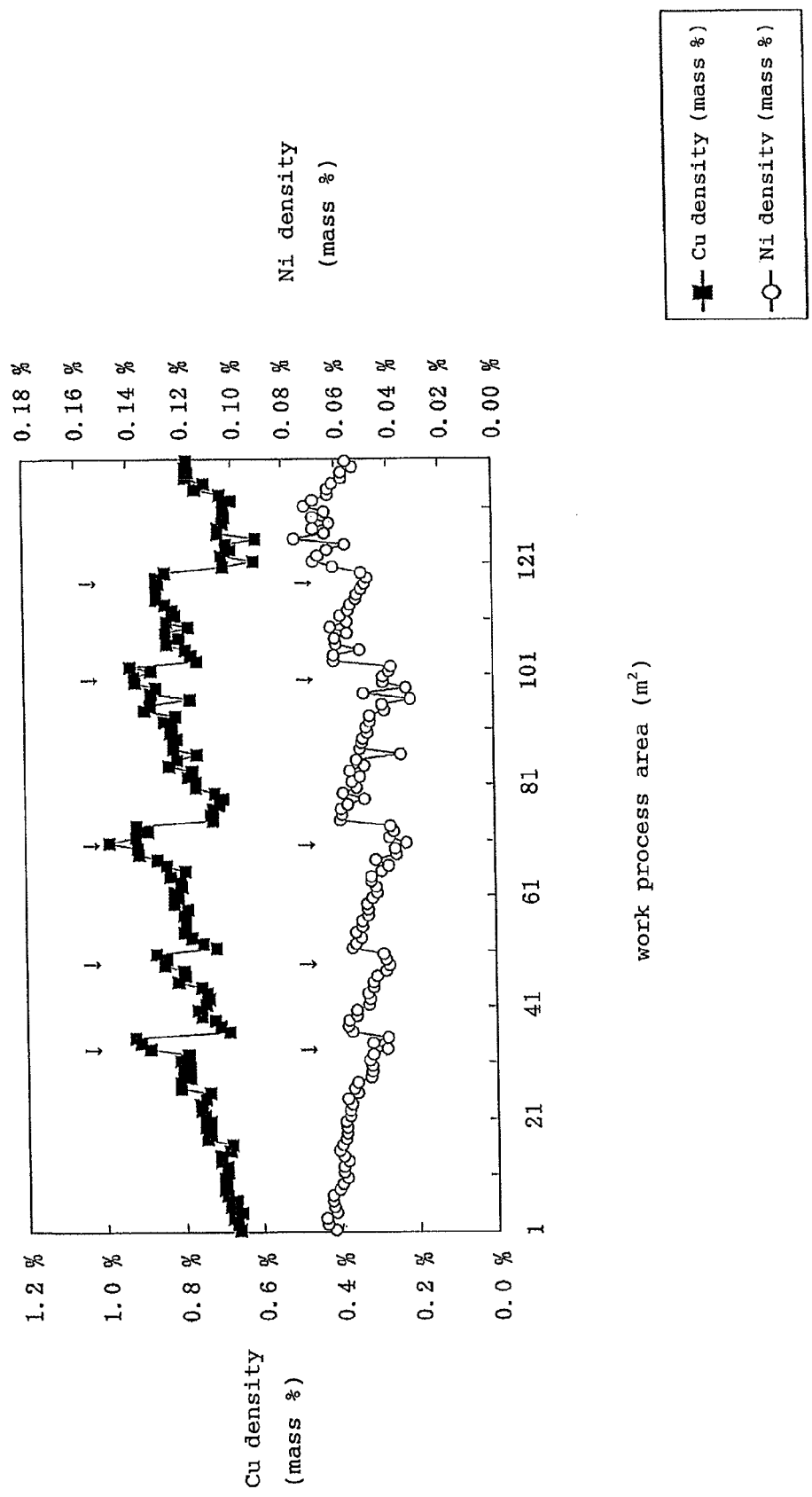
FIG. 2 is a plot of change in the Cu density and the Ni density of the solder dipping bath in the continuous soldering process with the air knife used in the post soldering process in accordance with the present invention.

The inventor prepared replenishment lead-free solder containing Ni of 0.15 mass percent and Sn as the remaining. In a similar way as above, the solder operation was performed on a printed board. The replenishment solder was entered into the solder dipping bath while the Cu density and the Ni density in the solder dipping bath were measured. More specifically, the above-described replenishment lead-free solder was introduced into the solder dipping bath before the Cu density was increased by 0.5 mass percent from the reference value and the Ni density was decreased by 0.03 mass percent form the reference value. FIG. 2 is a plot of changes in the Cu density and the Ni density in the solder dipping bath. Arrow marks represent timings at which the replenishment lead-free solder was introduced. Prior to the soldering operation, the reference values indicate the starting values of the Cu density and the Ni density in the solder dipping bath, and during the soldering operation, the values of the Cu density and the Ni density after the Cu density and the Ni density have changed by the largest amount as a result of introduction of the replenishment lead-free solder (more specifically, Cu for the maximum value, and Ni for the minimum value).

As shown in FIG. 2, the Cu density rapidly increases with an increase in the work process area while the Ni density rapidly decreases. By introducing the above-described replenishment lead-free solder, the Cu density and the Ni density were quickly restored to values close to the initial values thereof. As shown, the above-described replenishment lead-free solder was introduced by several times while the rise in the Cu density and the fall in the Ni density were monitored by a density measuring device. The Cu density and the Ni density were controlled with good repeatability to within appropriate ranges. The amount of introduced replenishment lead-free solder is appropriately determined based on the relationship with the amount of molten solder in the solder dipping bath. As for the appropriate ranges of the Cu density and the Ni density, the Cu density falls within a range from equal to or higher than 0.6 mass percent to equal to or lower than 1 mass percent, and the Ni density falls within a range from to equal to or higher than 0.02 mass percent to equal to or lower than 0.08 mass percent.

In another embodiment performing the same process and the measurement as described above, lead-free solder contained Sn as a main component with Cu having a density above 1.2 mass percent and Ni having a density below 0.01 mass percent or above 0.5 mass percent was introduced. In this case, even if the lead-free solder was introduced at any timing with the soldering operation performed, the rise in the Cu density of the solder dipping bath could not be controlled, and the density control was not successful. On the other hand, lead-free solder with Cu having a density below 1.2 mass percent and Ni having a density falling within a range from equal to or higher than 0.01 mass percent to equal to or lower than 0.5 mass percent contributed to density control. In particular, when the lead-free solder with a Cu density equal to or lower than 0.7 mass percent relatively quickly performed density control. When the Cu density was equal to or lower than 0.5 mass percent, density control was performed even more quickly. Lead-free solder having no Cu at all performed Cu density control adjustment most quickly and reliably.

In another embodiment, if lead-free solder containing Sn as a main component with the Cu density equal to or lower than 1 mass percent and the Ni density falling within a range from equal to or higher than 0.01 mass percent to equal to or lower than 0.5 mass percent stabilized the Ni density of the solder dipping bath to an appropriate range, specifically, to a range from equal to or higher than 0.02 mass percent to equal to or lower than 0.08 mass percent. If the Ni density fell within a range from equal to or higher than 0.05 mass percent to equal to or lower than 0.3 mass percent, the Ni density of the solder dipping bath was more quickly controlled to within the appropriate range. If the Ni density fell within a range from equal to or higher than 0.1 mass percent to equal to or lower than 0.2 mass percent, the dropped Ni density in the solder dipping bath was restored back most quickly. With the upper limit of the Ni density, the development of the Sn—Cu intermetallic compounds was reliably restrained.

When one of the HASL device and the die was to be used in the post soldering process in the present embodiment and another embodiment, the operating temperature of the solder dipping bath was set to within a range from equal to or higher than 260° C. to equal to or lower than 300° C. In this way, the development of the high-melting point Sn—Cu intermetallic compounds in the solder dipping bath was controlled in response to sharp change in the Cu and Ni densities due to special conditions in the post soldering process. Sufficient margin is thus permitted in the timing of the introduction of the replenishment lead-free solder having each of the above-described compositions. In other words, a wide range of the composition of the replenished lead-free solder to be introduced into the solder dipping bath is available. Because of the above operating temperature setting, even the lead-free solder having the Cu density equal to or lower than 1.2 mass percent can still contribute to density adjustment of the solder dipping bath. The temperature upper limit is 300° C. because Cu on the work excessively dissolves into the solder dipping bath above 300° C., and even if the replenishment lead-free solder is used, density control becomes extremely difficult. From this standpoint, the most preferable upper temperature limit to the operating temperature of the solder dipping bath is 280° C.

In another embodiment, the lead-free solder was introduced before a maximum increase of 0.3 mass percent in the Cu density from the predetermined value thereof was reached and a maximum decrease of 0.02 mass percent in the Ni density from the predetermined value thereof was reached. Continuous operation time is lengthened in comparison with the lead-free solder introduced with a larger amount of change than discussed above. The operating temperature of the solder dipping bath within a relatively lower temperature range from 262° C. to 263° C. worked.

Another specific embodiment of the present invention is described below. In this specific embodiment, a copper lead wire is immersed into the solder dipping bath and then excess solder covering the lead wire is removed by a die.

In this embodiment, as in the preceding embodiment, lead-free solder containing no elements other than Sn, Cu and Ni was used. More specifically, the lead-free solder contained cu having a density of 0.7 mass percent, Ni having a density of 0.05 mass percent and Sn as the remaining percentage portion. The lead-free solder became molten at a temperature 265° C. in the solder dipping bath. Under such conditions, the copper lead wire as a work was immersed into the solder dipping bath. The die and the copper lead wire were heated using a known heating device to increase ductility in expansion process.

When the copper lead wire covered with lead-free solder was expanded through the die in such a process, as above, Cu of the copper lead wire was removed together with excess solder. Cu then dissolved into the solder dipping bath and a quick increase in the Cu density of the solder dipping bath was recognized. A quick decrease in the Ni density of the solder dipping bath was also monitored.

The inventor prepared replenishment lead-free solder containing Ni having a density of 0.15 mass percent and Sn as the remaining percentage in the same case as the HASL device used in the post soldering process. As previously described, the soldering operation was repeatedly performed on the copper lead wire. The replenishment lead-free solder was introduced into the solder dipping bath as necessary while the Cu density and the Ni density of the solder dipping bath were measured. More specifically, the above-described lead-free solder for replenishment was added into the solder dipping bath before the Cu density increased by a 0.5 mass percent from the reference value and the Ni density decreased by a 0.03 mass percent. The definition of the reference value is the same as the one discussed with reference to the preceding embodiment which uses the HASL device in the post soldering process.

In terms of numerical evaluation, the same density adjustment effect as the one in the result of the post soldering process using the HASL device was obtained. In another embodiment, the same result as in the post soldering process using the HASL device was obtained. More specifically, when the lead-free solder containing Sn as a main component, Cu having a density above 1.2 mass percent and Ni having a density below 0.01 mass percent or above 0.5 mass percent was added at any timing, the rise in the Cu density of the solder dipping bath could not be controlled, and no density adjustment could be performed. When lead-free solder containing Cu having a density equal to or lower than 1.2 mass percent and Ni having a density falling within a range from equal to or higher than 0.01 mass percent to equal to or lower than 0.5 mass percent contributed to density control. In particular, when the lead-free solder with a Cu density equal to or lower than 0.7 mass percent relatively quickly performed density control. When the Cu density was equal to or lower than 0.5 mass percent, density control was performed even more quickly. The addition of lead-free solder having no Cu at all performed Cu density control adjustment most quickly and reliably.

In another embodiment, lead-free solder containing Sn as a main component, Cu having a density equal to or lower than 1.2 mass percent and Ni having a density falling within a range from equal to or higher than 0.01 mass percent to equal to or lower than 0.5 mass percent stabilized the Ni density of the solder dipping bath to within an appropriate range, specifically to within a range from equal to or higher than 0.02 mass percent to equal to or lower than 0.08 mass percent. If the Ni density was within a range from equal to or higher than 0.05 mass percent to equal to or lower than 0.3 mass percent, the Ni density of the solder dipping bath was controlled more quickly to within an appropriate range. If the Ni density was within a range from equal to or higher than 0.1 mass percent to equal to or lower than 0.2 mass percent, the once dropped Ni density of the solder dipping bath was most quickly restored and a seed for the development of the $(Ni,Cu)_6Sn_5$ intermetallic compounds caused as a result of a high Ni density was dissolved.

The embodiments of the present invention have been discussed for exemplary purposes only. In any of the above embodiments, the advantages of the present invention are provided even if the lead-free solder to be replenished contains, in addition to Cu and Ni, germanium (Ge) and phosphorus (P) as an antioxidant, each having a density of about 0.1 mass percent. In any of the above embodiments, the replenishment lead-free solder is added by a plurality of times. The advantages of the present invention are provided even if the replenishment lead-free solder is added continuously, continually or periodically in accordance with the mode of soldering operation (for example, depending on the type of works, an amount to be processed per day, or consistency of soldering process conditions) while the Cu density and the Ni density of the solder dipping bath are measured. When the soldering operation is performed under a constant condition, the density control is performed by adding the replenishment lead-free solder continuously, continually or periodically while the Cu and Ni densities are measured. With a known density measuring device in cooperation with a replenishing device, automatic density control is performed and a change in density is advantageously reduced.

INDUSTRIAL APPLICABILITY

The replenished lead-free solder and the control method for Cu density and Ni density in a solder dipping bath in accordance with the present invention are extremely effective as a production control technique to be applied to the soldering operation in the particular process using one of the HASL device and the die as the post soldering process.

The invention claimed is:

1. A control method for Cu density and Ni density in a solder dipping bath comprising a step of immersing a work including one of a printed circuit board having copper film coated thereon, a copper lead wire, and a copper tape into the solder dipping bath for soldering, and circulating solder, removed from the work by one of an air knife or a die, back into the solder dipping bath, wherein lead-free solder is replenished to the solder dipping bath before the Cu density in the solder dipping bath is increased by a maximum of 0.5 mass percent from a predetermined value and the Ni density in the solder dipping bath is decreased by a maximum of 0.03 mass percent from a predetermined value, the lead-free solder to be replenished including Sn as a major composition and at least Ni having a density falling within a range from equal to or higher than 0.01 mass percent to equal to or lower than 0.5 mass percent.

2. The method of claim 1 wherein the density of Ni falls within a range from equal to or higher than 0.05 mass percent to equal to or lower than 0.3 mass percent.

3. The method of claim 1 wherein the density of Ni falls within a range from equal to or higher than 0.1 mass percent to equal to or lower than 0.2 mass percent.

4. The method of claim 1 wherein the density of Cu falls within a range up to a maximum of 1.2 mass percent.

5. The method of claim 2 wherein the density of Cu falls within a range up to a maximum of 1.2 mass percent.

6. The method of claim 3 wherein the density of Cu falls within a range up to a maximum of 1.2 mass percent.

* * * * *